(12) United States Patent
Dixon et al.

(10) Patent No.: US 6,657,325 B2
(45) Date of Patent: Dec. 2, 2003

(54) MULTIPLE FAN SENSING CIRCUIT AND METHOD FOR MONITORING MULTIPLE COOLING FANS UTILIZING A SINGLE FAN SENSE INPUT

(75) Inventors: Robert Christopher Dixon, Austin, TX (US); Thoi Nguyen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 306 days.

(21) Appl. No.: 09/758,863

(22) Filed: Jan. 11, 2001

(65) Prior Publication Data

US 2002/0088615 A1 Jul. 11, 2002

(51) Int. Cl.[7] .................................................. H02J 7/00
(52) U.S. Cl. ........................................ 307/149; 307/413
(58) Field of Search ........................... 307/149, 42, 413

(56) References Cited

U.S. PATENT DOCUMENTS 5,990,582 A * 11/1999 Henderson et al. ......... 307/139
6,054,823 A * 4/2000 Collings et al. ............ 318/439

* cited by examiner

Primary Examiner—Gregory J. Toatley, Jr.
Assistant Examiner—Robert L. DeBeradinis
(74) Attorney, Agent, or Firm—Mark E. McBurney; Bracewell & Patterson, L.L.P.

(57) ABSTRACT

A multiple fan sensing circuit for use with a single fan sense input and method of operation thereof. The multiple fan sensing circuit includes a logic circuit, coupled to the fan sense input, that combines feedback signals from a first fan and a second fan. The first fan generates a tach signal indicative of the first fan operation and the second fan, e.g., a stuck rotor type fan, generates either an ON or OFF signal indicative of the second fan operation. In a related embodiment, the second fan generates a logic high signal in response to a failure in the second fan. In an advantageous embodiment, the logic circuit is a connector and a logic low level in the combined operational signal indicates a failed fan.

16 Claims, 3 Drawing Sheets

MULTIPLE FAN SENSING CIRCUIT AND METHOD FOR MONITORING MULTIPLE COOLING FANS UTILIZING A SINGLE FAN SENSE INPUT

BACKGROUND OF THE INVENTION

1. Technical Field

The present invention relates in general to cooling systems for electronic devices and, in particular, to the monitoring of cooling apparatus. More particularly, the present invention relates to a multiple fan sensing circuit and a method for monitoring multiple cooling fans utilizing a single sense pin.

2. Description of the Related Art

Integrated circuits and other electrical devices generally have rated operating temperature ranges. Within these operating ranges, the devices behave according to specified requirements. Outside of the rated operating range, the response characteristics of the circuits and devices can vary from the specified requirements. At elevated temperatures, it is known for integrated circuits and other electrical devices to fail or burn out or otherwise become defective. Accordingly, it is desirable to maintain circuits and devices within their rated operating temperature ranges.

In a computer system, continued operation of an electronic device leads to the generation of heat. In some instances, albeit rare, ambient air is sufficient to provide cooling to maintain the circuit or device within the desired operating temperature range. However, some circuits or components generate enough heat to require affirmative cooling from a cooling fan. Typically, computers have included a cooling fan inside the computer housing to prevent overheating caused by the normal operation of the computer. Also, it not uncommon for a computer system, such as a server system, to utilize more than one cooling fan to maintain a specified operating temperature.

Computer systems must monitor their cooling fans to verify that the fans are powered on and rotating at a predetermined speed to maintain a desired thermal condition that precludes accelerated failures of electronic devices utilized in the computer systems. Typically, each cooling fan generates a "feedback" signal that provides information, such as rotational speed. A monitoring processor, typically a system processor, receives this feedback signal at a fan sense pin. As additional fans are added to a system, e.g., to compensate for additional electronic devices due to system upgrades, such as faster and larger disk drives, existing hardware, e.g., system I/O (Input/Output) planar boards, and/or system firmware must also be "upgraded" to accommodate the additional fans feedback signals. In the case of the system I/O planar board, additional inputs on the I/O board are required for the additional feedback signals. Additionally, the firmware monitoring the status of the fan must also be modified to account for the additional signal inputs. In either of the above described situations, a system upgrade to install additional fans can be time consuming and costly.

Accordingly, what is needed in the art is an improved method for installing additional fans to a system that mitigates the limitations discussed above. More particularly, what is needed in the art is a method for adding fans to a system that does not require additional hardware and/or firmware changes.

SUMMARY OF THE INVENTION

It is therefore an object of the invention to provide an improved cooling system.

It is another object of the invention to provide a multiple fan sensing circuit and a method of operation thereof.

To achieve the foregoing objects, and in accordance with the invention as embodied and broadly described herein, a multiple fan sensing circuit for use with a single fan sense input is disclosed. The multiple fan sensing circuit includes a logic circuit, coupled to the fan sense input, that combines feedback signals from a first fan and a second fan. The first fan generates a tach signal indicative of the first fan operation and the second fan, e.g., a stuck rotor type, generates either an ON or OFF signal indicative of the second fan operation. In a related embodiment, the second fan generates a logic low signal in response to a failure in the second fan. In an advantageous embodiment, the logic circuit is a connector and a logic low level in the combined operational signal indicates a failed fan.

The present invention recognizes that as additional fans are added to a system, the number of fan sense pins available for monitoring fan status and operation becomes a limiting factor. Typically, a system architecture only provides a limited number of fan sense lines. As soon as the number of fans employed in the system exceed the number the number of fan sense lines, the system cannot monitor and ensure that all the fans are operational, e.g., powered on and rotating at the appropriate speed, to maintain a desired thermal condition. Furthermore, the additional fans would also require that existing hardware, such as system I/O planar circuit boards be replaced or modified to accommodate the additional feedback signals from the additional fans. The additional fans may also necessitate replacing or modifying the system firmware to account for the additional fans. The present invention overcomes the above discussed problem of replacing/modifying hardware and/or firmware to accommodate additional fans by disclosing a novel multiple fan sensing circuit that allows a single sense line to monitor more than one fan utilizing existing fan monitoring hardware and firmware.

In another aspect of the present invention, an upgradeable fan circuit for use with a cooling system having a first fan that provides a tach feedback signal through a feedback connector is disclosed. The upgradeable fan circuit includes an auxiliary fan that generates an ON or OFF feedback signal indicative of the auxiliary fan operation. The upgradeable fan circuit also includes a first connector coupled to the feedback connector, and a second connector coupled to the auxiliary fan and the first connector that combines the tach feedback signal from the first fan with the feedback signal from the auxiliary fan and provides the combined feedback signal to a fan sense input.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
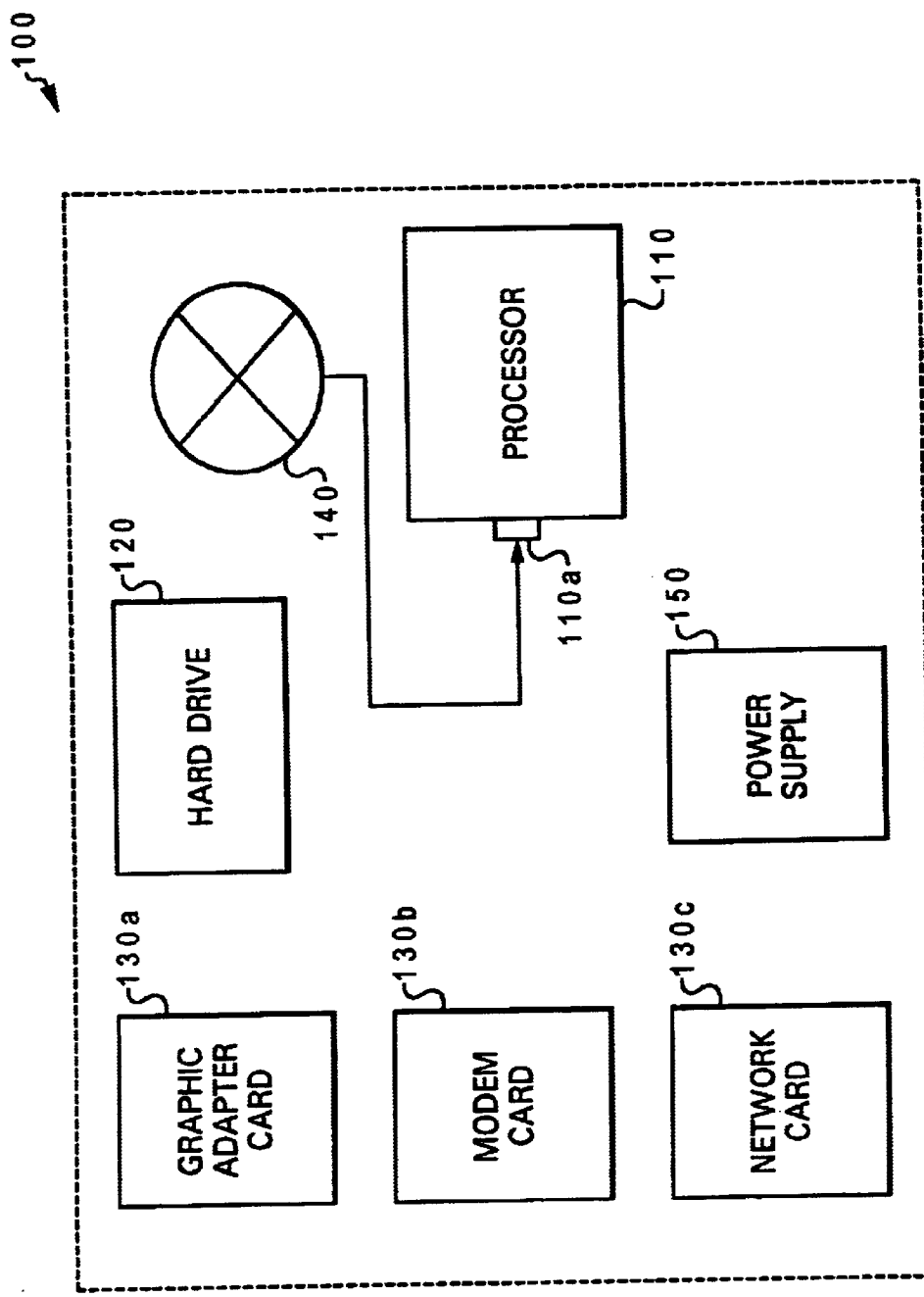
FIG. 1 illustrates an exemplary data processing system that provides a suitable environment for the practice of the present invention.

With reference now to the figures and in particular with reference to FIG. 1, there is depicted an exemplary data processing system 100 that provides a suitable environment for the practice of the present invention. Data processing system 100, such as a personal computer (PC), includes a processor 110, such as a conventional microprocessor, coupled to a number of electronic devices. As shown in the illustrated embodiment, the electronic devices generally include a power supply 150 for providing power, a non-volatile memory device, i.e., hard drive 120, and a plurality of circuit boards, generally designated 130a–130c, such as a graphic adapter card, modem card and network communication card. As discussed previously, these electronic devices generate heat when they are in operation. To dissipate the generated heat and prevent component failures due to elevated temperatures, a cooling fan 140 is utilized in the illustrated embodiment to provide a means of removing the generated heat from an enclosure (not shown) that houses the electronic devices. The operation of fan 140 is monitored by processor 110 via a fan sense pin 110a. The monitoring of fan 140 will hereinafter be described in greater detail with respect to FIG. 2, with continuing reference to FIG. 1.

Figure 2:
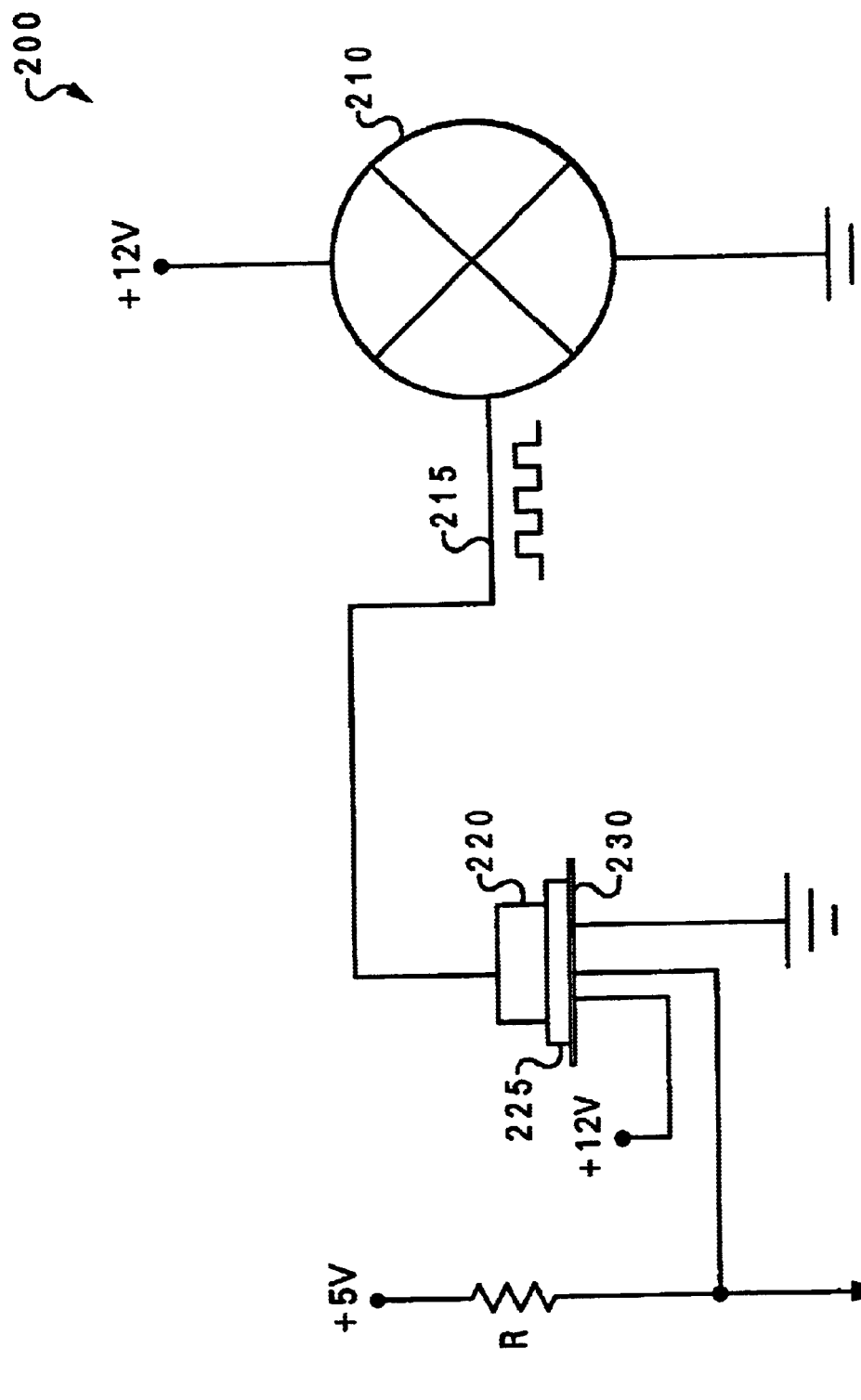
FIG. 2 illustrates a conventional cooling system that provides a suitable environment for the practice of the present invention.

Referring now to FIG. 2, there is illustrated a conventional cooling system 200 that provides a suitable environment for the practice of the present invention. Cooling system includes a cooling fan 210 utilizing a fan sense pin. Cooling fan 210 (analogous to fan 140 in FIG. 1) generates a tach feedback signal 215, i.e., a pulse train, that is indicative of the fan's operation. The tach feedback signal provides information, such as speed and failure condition, with respect to cooling fan's 210 operation. As shown in the illustrated embodiment, tach signal 215 is coupled to a board connector 225 that is typically permanently mounted on a planar Input/Output (I/O) circuit board 230 utilizing a connector 220. Generally, planar I/O circuit board 230 "conditions" tach signal 215 prior to forwarding tach signal 215 to a fan sense pin of a "monitoring" processor (analogous to processor 110 in FIG. 1). The monitoring processor, in turn, utilizes the information from tach signal 215 to verify the status and operation of cooling fan 210.

In the event of that additional electronic devices are added to data processing system 100, e.g., firmware upgrades or additional circuit boards, such as sound cards, the overall thermal characteristics of data processing system 100 changes with the increased heat generation. These additions to data processing system 100 may not have considered or envisioned when data processing system's 100 architecture was first designed. The heat generated by the additional "upgrades" may exceed the cooling, or heat dissipation, capacity fan 140. Typically, to mitigate the additional heat generated by any additional electronic device, cooling fan 140 may be replaced with a greater cooling capacity fan or a second fan (not shown) may be installed to compensate for the additional heat generated by the additional devices.

The present invention recognizes that as additional fans are added to a system, the number of fan sense pins available for monitoring fan status and operation becomes a limiting factor. Typically, a system architecture only provides a limited number of fan sense lines. As soon as the number of fans employed in the system exceed the number the number of fan sense lines, the system cannot monitor and ensure that all the fans are operational, e.g., powered on and rotating at the appropriate speed, to maintain a desired thermal condition. Furthermore, the additional fans would also require that existing hardware, such as system I/O planar circuit boards be replaced or modified to accommodate the additional feedback signals from the additional fans. The additional fans may also necessitate replacing or modifying the system firmware to account for the additional fans. The present invention overcomes the above discussed problem of replacing/modifying hardware and/or firmware to accommodate additional fans by disclosing a novel multiple fan sensing circuit that allows a single sense line to monitor more than one fan utilizing existing fan monitoring hardware and firmware.

Figure 3A:
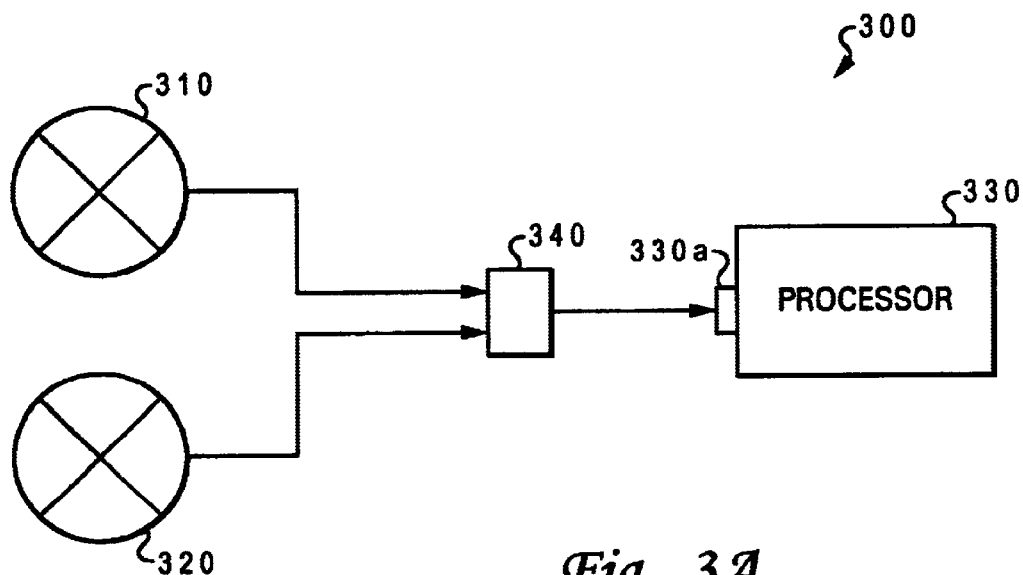
FIG. 3A illustrates a simplified block diagram of an embodiment of a multiple fan sensing circuit according to the principles disclosed by the present invention.

Referring now to FIG. 3A, there is depicted a simplified block diagram of an embodiment of a multiple fan sensing circuit 300 according to the principles disclosed by the present invention. In the illustrated embodiment, each of first and second fans 310, 320 generates a feedback signal that are indicative of the fan's operation to a logic circuit 340 that, in an advantageous embodiment, is a connector that performs a logical OR operation with the feedback signals from first and second fans 310, 320. Alternatively, in another advantageous embodiment, logic circuit 340 may be implemented in a conventional micro-controller device. The combined signal from logic circuit 340 is, in turn, provided to a fan sense pin 330a of a processor 330 (analogous to processor 110 in FIG. 1) that is utilized to monitor the operation of first and second fans 310, 320.

In an advantageous embodiment, first fan 310 generates a tach signal, i.e., a pulse train, that provides information as to the status and operation of first fan 310. For example, each pulse may represent a complete revolution and information with respect to the fan speed may be determined based on the number of pulses in a given period of time. This type of information is particularly useful to processor 330 which may adjust the speed of first fan 310 to the current thermal conditions of a system employing first fan 310. Additionally, the absence of pulses in the feedback signal will indicate that the fan is not functional and allow processor 330 to initiate any predetermined corrective actions necessary to prevent a system failure, e.g., shutting down the system. As discussed previously, in the event that additional cooling capacity is required due, e.g., to accommodate additional heat generating electronic devices in a system upgrade, an additional fan, or possibly more, may be needed to provide the necessary cooling to prevent failures due to over-heating. However, the number of fan sense pins available for monitoring the operational status of fans is a significant limitation to the number of fans that can be effectively monitored by processor 330.

In the case that processor 330 has only a single fan sense pin 330a, which is typically the case for most systems, adding another fan feedback signal to fan sense pin 330*a* may not be desirable. For example, if second fan 320 utilizes a tach feedback signal, the two feedback signals will essentially "mask" each other so that processor 330 cannot determine the speed of either fan or if both fans are operational without hardware modifications and firmware upgrades. The present invention overcomes this significant limitation by utilizing a fan that generates a feedback signal that does not mask the tach signal of the existing fan, i.e., first fan 310. In an advantageous embodiment, second fan 320 is a "stuck rotor" type fan with a open-collector transistor output. A stuck rotor fan produces a logic high, or an "OFF" transistor output, under normal conditions and a logic low, or an "ON" transistor output, for a stuck rotor condition, i.e., failure. Thus, second fan 320 feedback signal generates a logic high signal, or an OFF transistor output, when second fan 320 is functioning normally and a logic low signal, or an ON transistor output, in the event that second fan 320 encounters a failure in its operation, e.g., stuck rotor condition. In this manner, when both first and second fans 310, 320 are functioning properly, the combined signal received at fan sense pin 330*a* is first fan's 310 tach signal. In the event that second fan 320 has failed, the combined signal will be a logic low. Similarly, in the event that first fan 310 has failed, the combined signal may be a logic high or logic low, depending on first fan's 310 failure signal. In either event, processor 330 will be able to continue monitoring the operational status of first fan 310, e.g., rotational speed, while being able to detect a failure in either fan without any significant hardware modifications and/or firmware upgrades.

Figure 3B:
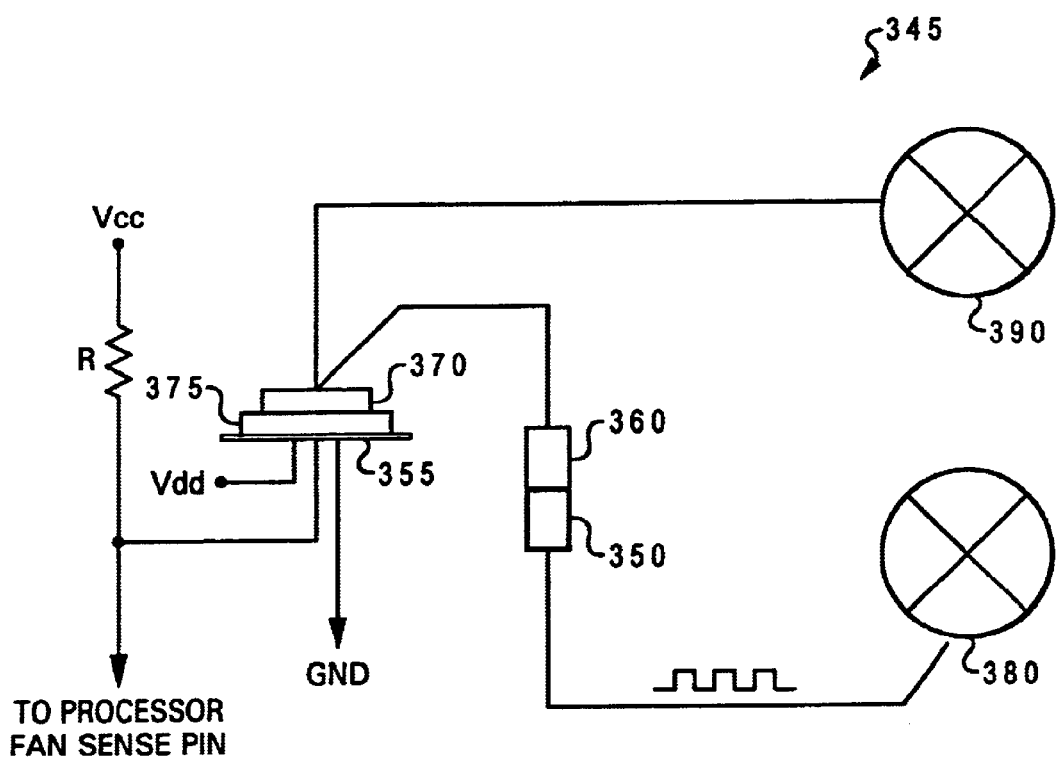
FIG. 3B illustrates an embodiment of a cooling system utilizing a field upgradeable fan circuit according to the principles disclosed by the present invention.

Referring now to FIG. 3B, there is illustrated an embodiment of a cooling system 345 utilizing a field upgradeable fan circuit according to the principles disclosed by the present invention. The field upgradeable fan circuit includes an auxiliary fan 390 (analogous to second fan 320 in FIG. 3B) that generates a logic high signal when functioning properly and a logic low signal in the event of a failure in its operation. The field upgradeable fan circuit also includes first and second connectors 360, 370 and is utilized to increase the cooling capacity of an existing cooling system (analogous to cooling system 200 depicted in FIG. 2) without having to modify existing hardware or upgrade firmware to accommodate auxiliary fan 390. The existing cooling system includes a first fan 380 that provides a tach feedback signal to a processor's fan sense pin via a feedback connector 350 connected to a mating connector 375 permanently mounted on a planar I/O circuit board 355.

The field upgradeable fan circuit is incorporated into the existing cooling system by removing feedback connector 350 from mating connector 375 on planar I/O circuit board 355 and connecting second connector 370 in its place. The removed feedback connector 350 is then coupled to first connector 360, which is a mating connector, resulting in a "wired-OR" configuration of first and auxiliary fans 380, 390. As described, the installation of the upgradeable fan circuit is relatively straight forward and easy to accomplish. Furthermore, as discussed previously, no hardware modification to existing hardware, such as planar I/O circuit board 355, is needed and the existing monitoring firmware does not have to be modified to account for auxiliary fan 390.

While the invention has been particularly shown and described with reference to a preferred embodiment, it will be understood by those skilled in the art that various changes in form and detail may be made therein without departing from the spirit and scope of the invention.

What is claimed is:

1. A multiple fan sensing circuit comprising:
    a logic circuit that combines a tach signal from a first fan and a condition signal from a second fan to form a combined output signal, such that said condition signal masks said tach signal in said combined output signal if said condition signal indicates a malfunction in said second fan.

2. The multiple fan sensing circuit as recited in claim 1, wherein said logic circuit is connected to a fan sense input that receives said combined output signal from said logic circuit, such that if said combined output signal indicates said malfunction in said second fan, a device connected to said fan sense input is adjusted in response to said malfunction in said second fan.

3. The multiple fan sensing circuit as recited in claim 1, wherein said logic circuit includes an OR logic.

4. The multiple fan sensing circuit as recited in claim 3, wherein said condition signal is logically high when said second fan malfunctions, and wherein said combined output signal is a steady logic high signal that masks said tach signal of said first fan.

5. The multiple fan sensing circuit as recited in claim 4, wherein said logic circuit is connected to a fan sense input that receives said combined output signal from said logic circuit, such that if said combined output signal indicates said malfunction in said second fan, a device connected to said fan sense input is adjusted in response to said malfunction in said second fan.

6. A method for monitoring multiple fans utilizing a single fan sense input, said method comprising:
    combining a tach signal from a first fan and a condition signal from a second fan into a single combined signal such that said condition signal masks said tach signal in said single combined signal if said condition signal indicates a malfunction in said second fan; and
    providing said single combined signal to a single fan sense input whereby said first and second fans operations can be monitored without hardware modification or firmware upgrade.

7. The method as recited in claim 6, wherein said combining said tach signal and said condition signal includes performing a logical ORing operation of said tach and condition signals utilizing a logic circuit.

8. The method as recited in claim 7, wherein said condition signal is a logic high signal when said second fan is malfunctioning, and wherein said combined output signal is a steady logical high signal that masks said tach signal of said first fan.

9. A multiple fan sensing circuit for use with a fan sensing input, said multiple fan sensing circuit comprising:
    a logic circuit, coupled to a fan sensing input, that combines a tach signal from a first fan and a condition signal from a second fan to form a combined output signal, such that said condition signal masks said tach signal in said combined output signal if said condition signal indicates a properly functioning second fan.

10. The multiple fan sensing circuit of claim 9, wherein said logic circuit is connected to a fan sense input, such that if said combined output signal indicates a malfunction in said second fan, a device connected to said fan sense input is adjusted in response to said malfunction in said second fan.

11. The multiple fan sensing circuit of claim 9, wherein said logic circuit includes an OR logic.

12. The multiple fan sensing circuit of claim 11, wherein said condition signal is low when said second fan malfunctions, wherein said combined output signal is the same as said tach signal from said first fan.

13. A cooling system, comprising:
a first fan that generates a tach signal;
a second fan that generates a condition signal indicating if there is a malfunction in said second fan;
a logic circuit that combines said tach signal from said first fan and said condition signal from said second fan into a combined output signal;
means for connecting said logic circuit to a fan sensor input for receiving said combined output signal; and
means for connecting a device to said fan sensor input, wherein a malfunction in said second fan creates said combined output signal such that said tach signal is masked.

14. The cooling system as recited in claim 13, wherein an operation of said device connected to said fan sensor input is adjusted in response to said malfunction of said second fan.

15. The cooling system as recited in claim 13, wherein said logic circuit includes an OR logic.

16. The cooling system as recited in claim 15, wherein said condition signal is a logical high when said second fan malfunctions, wherein said combined output signal is a steady logic high that masks said tach signal from said first fan in said combined output signal.

* * * * *